United States Patent
Wei et al.

(10) Patent No.: US 8,760,353 B2
(45) Date of Patent: Jun. 24, 2014

(54) ACTIVE ANTENNA

(75) Inventors: Wenjie Wei, Shenzhen (CN); Yong Fu, Shenzhen (CN); Weihua Sun, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/602,737

(22) Filed: Sep. 4, 2012

(65) Prior Publication Data

US 2013/0056605 A1   Mar. 7, 2013

Related U.S. Application Data

(63) Continuation of application No. PCT/CN2010/079284, filed on Sep. 2, 2011.

(51) Int. Cl.
    *H01Q 1/24*  (2006.01)
(52) U.S. Cl.
    USPC ............................................ 343/702; 343/882
(58) Field of Classification Search
    CPC .......... H01Q 1/1207; H01Q 21/0025
    USPC ............. 343/700 MS, 702, 878, 882
    See application file for complete search history.

(56) References Cited

U.S. PATENT DOCUMENTS

| | | | |
|---|---|---|---|
| 5,730,620 A * | 3/1998 | Chan et al. | 439/526 |
| 6,426,724 B2 * | 7/2002 | Gunee et al. | 343/702 |
| 6,734,663 B2 * | 5/2004 | Fye et al. | 324/142 |
| 7,145,062 B2 | 12/2006 | Ishida | |
| 2009/0289116 A1 * | 11/2009 | Copeland et al. | 235/440 |
| 2011/0036206 A1 | 2/2011 | Yang | |

FOREIGN PATENT DOCUMENTS

| | | |
|---|---|---|
| CN | 1784813 A | 6/2006 |
| CN | 1971368 A | 5/2007 |
| CN | 101608651 A | 12/2009 |
| CN | 201571701 U | 9/2010 |
| CN | 201876780 U | 6/2011 |

* cited by examiner

*Primary Examiner* — Tho G Phan
(74) *Attorney, Agent, or Firm* — Leydig, Voit & Mayer, Ltd.

(57) ABSTRACT

An active antenna, comprising: a main board and at least one wireless module; a first buckle member set on the at least one wireless module, a second buckle member set on the main board corresponding to the first buckle member on the least one wireless module; the first buckle member of the at least one wireless module clasps the second buckle member of the main board, thereby fixing the wireless module on the main board. The active antenna has advantages of low maintenance cost and high maintenance efficiency.

21 Claims, 6 Drawing Sheets

ACTIVE ANTENNA

CROSS-REFERENCE TO RELATED APPLICATIONS

This application is a continuation of International Patent Application No. PCT/CN2011/079284, filed on Sep. 2, 2011, which is hereby incorporated by reference in its entirety.

TECHNICAL FIELD

The present invention relates to the antenna field, and more specifically, to an active antenna.

BACKGROUND

An active antenna system (AAS) refers to an antenna with active devices. The AAS as a novel antenna product is widely applied in various situations, such as residential districts, squares, parks, etc. In practical applications, an AAS is commonly mounted in a high terrain station to improve its radiation scope. For example, a common AAS is mounted to the top of an antenna supporter on a ceiling or roof. Besides, in order not to influence service continuity, regular maintenance is necessary for an AAS.

FIG. 1 is a schematic structure diagram of an existing AAS. As shown in FIG. 1, the AAS is mainly composed of wireless modules 1 and a main board 2. In practical applications, a lowest wireless module 1 is typically fastened on the main board 2 with 8 screws, and remaining wireless module 1 is typically fastened on the main board 2 with 6 screws. In the maintenance of an AAS similar to that shown in FIG. 1, because there are so many screws, in order to improve safety, the AAS is commonly detached from the top of its supporter as a whole, and is serviced after the screws are removed.

It has been found in practice that the existing AAS is commonly heavy and bulky, the complete detachment of AAS needs multiple person cooperation, leading to high maintenance cost; further, tools are needed for detachment in the maintenance, so that maintenance efficiency is low.

SUMMARY OF THE INVENTION

With regard to the above defects, an active antenna is provided in an embodiment of the present invention, which has advantages of low maintenance cost and high maintenance efficiency.

An active antenna, comprising:
a main board and at least one wireless module;
a first buckle member set on the at least one wireless module, a second buckle member set on the main board corresponding to the first buckle member on the least one wireless module; wherein,
the first buckle member of the at least one wireless module clasps the second buckle member of the main board thereby fixing the wireless module on the main board.

In embodiments of the present invention, a second buckle member corresponding to the first buckle member of a wireless module is set on the main board of the active antenna, and the first buckle member of a wireless module clasps the second buckle member of the main board thereby fixing the wireless module on the main board. That is to say, in the embodiments of the present invention, wireless modules and a main board are tightly engaged together to avoid screw fastening, which offers possibility for a single person to detach and attach a wireless module aloft by hands, without the multiple person cooperation and tools for detachment and attachment, so that the maintenance cost of the active antenna can be reduced and maintenance efficiency can be improved.

BRIEF DESCRIPTION OF THE DRAWINGS

For a more explicit description of the technical solutions of embodiments of the present invention, a brief introduction of accompanying drawings to be used in the description of these embodiments will be given below. It is obvious that accompanying drawings described below are merely some embodiments of the present invention, and other accompanying drawings can be derived from these ones for those skilled in the art without any creative efforts.

DETAILED DESCRIPTION OF THE EMBODIMENTS

A clear and complete description of technical solutions of embodiments of the present invention will be given with reference to the accompanying drawings of the embodiments of the present invention. It is obvious that embodiments described herein are merely portions embodiments of the present invention, but not all of them. Based on those embodiments of the present invention, other embodiments can occur to those skilled in the art without any creative efforts, all of which fall within the scope of the present invention.

An active antenna is provided in an embodiment of the present invention, which includes a main board and at least one wireless module; a first buckle member set on the at least one wireless module, and a second buckle member set on the main board corresponding to the first buckle member on the least one wireless module. The first buckle member of the at least one wireless module clasps the second buckle member of the main board, thereby fixing the wireless module on the main board. The active antenna has advantages of low maintenance cost and high maintenance efficiency, which will be described in detail through following particular embodiments.

Embodiment 1

Figure 1:
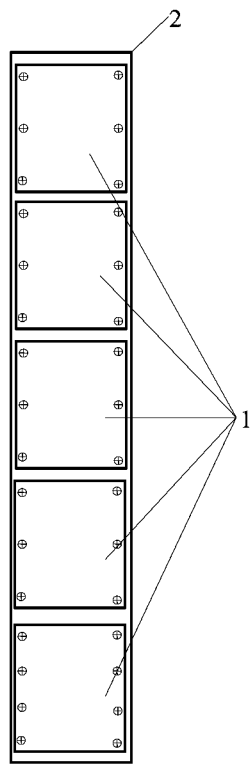
FIG. 1 is a schematic structure diagram of an existing AAS.
Figure 2:
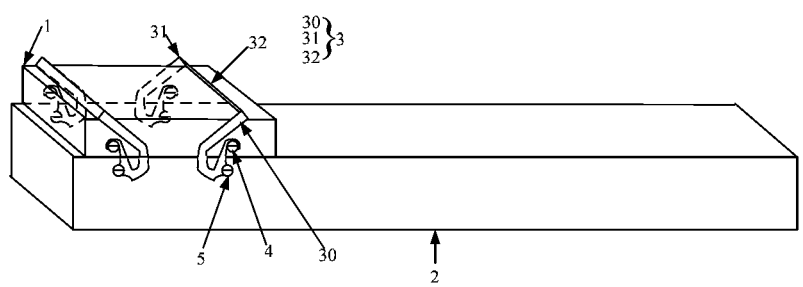
FIG. 2 is a schematic structure diagram of an AAS provided in an embodiment of the present invention.

Referring to FIG. 2, FIG. 2 is a schematic structure diagram of an AAS provided in an embodiment of the present invention. As shown in FIG. 2, the AAS may include:
a main board 2 and at least one wireless module 1; a first buckle member set on the at least one wireless module 1, a second buckle member set on the main board 2 corresponding to the first buckle member on the least one wireless module 1. The first buckle member of the at least one wireless module clasps the second buckle member of the main board thereby fixing the wireless module 1 on the main board 2.

In this embodiment and subsequent embodiments, the word clasp refers to tool-less manual mounting.

Alternatively, in the AAS shown in FIG. 2, the second buckle member set on the main board 2 may includes at least one group of engaging elements 3, at least one engaging arm 30 of the at least one group of engaging elements 3 is pivotedset on one side of the main board 2, and at least another engaging arm 31 of the at least one group of engaging elements 3 is pivotedset on the other side of the main board 2. As shown in FIG. 2, the side of the main board 2 occupied by the at least one wireless module 1 intersects with the side of the main board 2 where the at least one engaging arm 30 is set as well as the side of the main board 2 where the at least another engaging arm 31 is set respectively.

Correspondingly, in the AAS shown in FIG. 2, the first buckle member set on the at least one wireless module 1 may includes protrusions 4 corresponding to the at least one engaging arm 30 and the at least another engaging arm 31 respectively; the protrusions 4 are set on two sides of the wireless module 1 adjacent to the side covered by the main board 2.

In the embodiment, as shown in FIG. 2, a buckle is formed on each engaging arm, i.e., engaging arm 30 and engaging arm 31, of the at least one group of engaging elements 3 on the end corresponding to the protrusion 4 of the first buckle member. In the fixing state of the wireless module 1 and the main board 2, the buckle of each engaging arm, i.e., engaging arm 30 and engaging arm 31, clasps to the protrusion 4 set on the wireless module 1.

Alternatively, in the AAS shown in FIG. 2, the second buckle member set on the main board 2 may includes rotation shafts 5. The engaging arms of the second buckle member, i.e., engaging arm 30 and engaging arm 31, can be pivotedset on the main board 2 through a rotation shaft 5, that is, the engaging arm 30 is pivotedset on one side of the main board 2 through another rotation shaft 5, and the engaging arm 31 is pivotedset on the other side of the main board 2 through the rotation shaft 5.

Alternatively, in the AAS shown in FIG. 2, the rotation shaft 5 set on one side of the main board 2 and connected to the engaging arm 30 and the rotation shaft 5 set on another side of the main board 2 and connected to the engaging arm 31 can be an integrated structure which will enhance the stability of the rotation of the engaging arms 30, 31. Certainly, the implementation of the present invention will not be affected in case that the rotation shaft 5 set on one side of the main board 2 and connected to the engaging arm 30 and the rotation shaft 5 set on another side of the main board 2 and connected to the engaging arm 31 are not an integrated structure.

Alternatively, in the AAS shown in FIG. 2, each group of engaging elements 3 includes two engaging arms, i.e., engaging arm 30 and engaging arm 31, which are symmetrically set on opposite sides of the main board 2.

Alternatively, in the AAS shown in FIG. 2, the two engaging arms, i.e., engaging arm 30 and engaging arm 31, of each group of engaging elements 3 set on the main board 2 are connected with a transverse rod 32, which is arranged on the opposite end to the buckles of the two engaging arms, i.e., engaging arm 30 and engaging arm 31, connected by transverse rod 32. In the fixing state of the wireless module 1 and the main board 2, the transverse rod 32 tightly presses the wireless module 1 from the side of the wireless module 1 away from the main board 2 to facing the direction where the main board 2 located. Wherein, the transverse rod 32 can stand the wireless module 1 in raise, lift operations during transport, and can provide a support force in the assembly of the wireless module 1 and the main board 2 to meet fastening requirement.

Alternatively, in the AAS shown in FIG. 2, the buckle formed on each engaging arm, i.e., engaging arm 30 and engaging arm 31, of each group of engaging elements 3 on the end corresponding to the protrusion 4 of the first buckle member is a crook structure. As shown in FIG. 2. In the fixing state of the wireless module 1 and the main board 2, the crook structure of each engaging arm, i.e., engaging arm 30 and engaging arm 31, and the protrusion set on the wireless module 1 buckle with each other, and the opening of the crook structure faces towards the side where the main board 2 is located.

Figure 3:
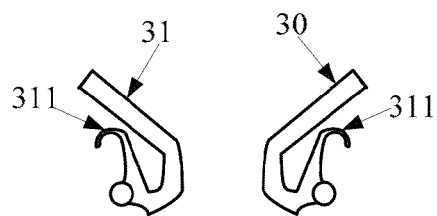
FIG. 3 is an enlarged schematic diagram of engaging arms of each group of engaging elements set on a main board 2 of an AAS.

Also referring to FIG. 3, FIG. 3 is an enlarged schematic diagram of engaging arms 30, 31 of each group of engaging elements 3 set on the main board 2 of the AAS shown in FIG. 2. As shown in FIG. 3, the buckles formed on the engaging arms 30, 31 of each group of engaging elements 3 at the end corresponding to the protrusions 4 of the wireless module 1 are crook structures 311. In the fixing state of the wireless module 1 and the main board 2, the crook structure 311 of each engaging element, i.e., engaging arm 30 and engaging arm 31, and a protrusion 4 set on the wireless module 1 buckle with each other, and the opening of the crook structure 311 faces towards the side where the main board 2 is located.

Figure 4:
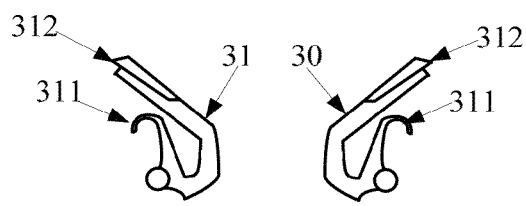
FIG. 4 is a schematic structure diagram of another AAS provided in an embodiment of the present invention.

Alternatively, in the engaging arms 30, 31 shown in FIG. 3, a flange 312 may be formed on the outer surface of each engaging arm at the opposite end to the buckle, i.e., the crook structure 311, the flange 312 is perpendicular to the outer surface as shown in FIG. 4. That is, a flange 312 may be formed on the outer surface of the engaging arm 30 at the opposite end to the crook structure 311, and the flange 312 is perpendicular to the outer surface of the engaging arm 30; a flange 312 may be also formed on the outer surface of the engaging arm 31 at the opposite end to the crook structure 311, which is perpendicular to the outer surface of the engaging arm 31. Wherein, providing flanges 312 on the outer surfaces of engaging arms 30 and 31 can convenience rotation of the engaging arms 30 and 31.

In Embodiment 1, the wireless module and the main board of an active antenna are tightly engaged to avoid fastening with screws, making it possible for an operator to perform attaching and detaching operations aloft by hands without multiple person cooperation and tools for detachment and attachment, so that the maintenance cost of the active antenna can be reduced and maintenance efficiency can be improved.

Embodiment 2

Figure 5:
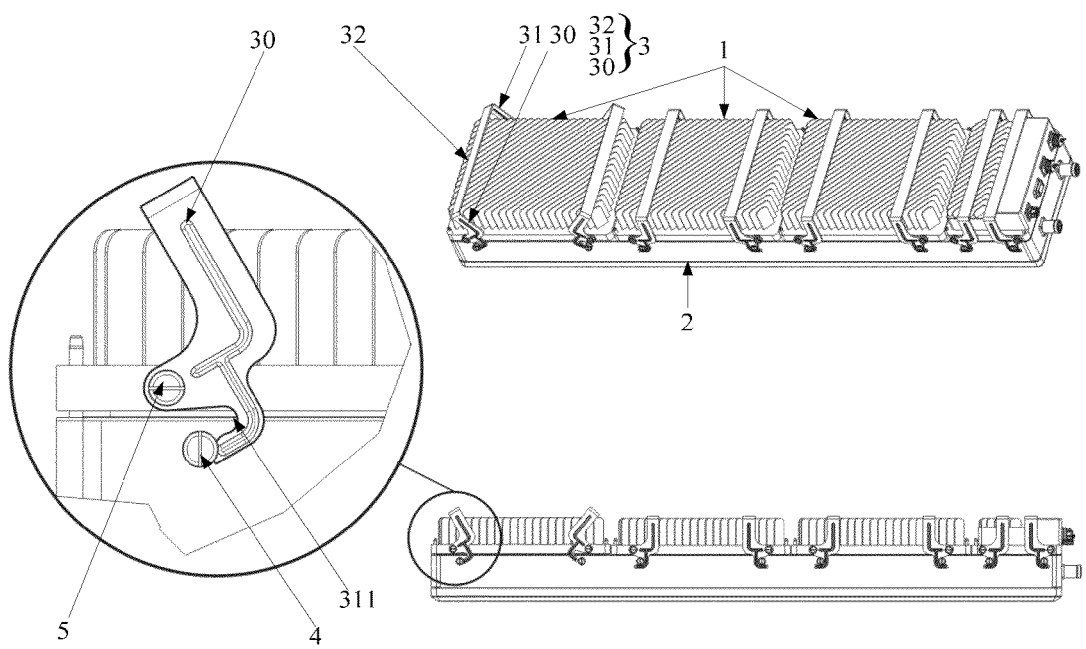
FIG. 5 is a schematic structure diagram of another AAS provided in an embodiment of the present invention.

Referring to FIG. 5, FIG. 5 is a schematic structure diagram of another AAS provided in an embodiment of the present invention. As shown in FIG. 5, the AAS may include:

A main board 2 and at least one wireless module 1; a first buckle member set on the at least one wireless module 1, a second buckle member set on the main board 2 corresponding to the first buckle member on the least one wireless module 1; the first buckle member of the at least one wireless module 1 clasps the second buckle member of the main board 2, thereby fixing the wireless module 1 on the main board 2.

Alternatively, in the AAS shown in FIG. 5, the first buckle member set on the wireless module 1 may include at least one group of engaging elements 3, at least one engaging arm 30 of the at least one group of engaging elements 3 is pivoted on one side of the wireless module 1, and at least another engaging arm 31 of the at least one group of engaging elements 3 is pivoted on the other side of the wireless module 1. As shown in FIG. 5, the side of the wireless module 1 where the at least one engaging arm 30 is set as well as the other side of the wireless module 1 where the at least another engaging arm 31 is set intersect with the side of the wireless module 1 covered by the main board 2 respectively.

Correspondingly, in the AAS shown in FIG. 5, the second buckle member set on the main board 2 may include protrusions 4 corresponding to the at least one engaging arm 30 and the at least another engaging arm 31 respectively; the protrusions 4 are set on two sides of the main board 2 adjacent to the side occupied by the wireless module 1.

In this embodiment, as shown in FIG. 5, a buckle is formed on each engaging arm, i.e., engaging arm 30 and engaging arm 31, of the at least one group of engaging elements 3 at the end corresponding to the protrusion 4 of the second buckle member. In the fixing state of the wireless module 1 and the main board 2, the buckle of each engaging arm, i.e., engaging arm 30 and engaging arm 31, clasps to the protrusion 4 set on the main board 2.

Alternatively, in the AAS shown in FIG. 5, the first buckle member set on the wireless module 1 may include rotation shafts 5. The engaging arms of the first buckle member, i.e., engaging arm 30 and engaging arm 31, can be pivoted on the wireless module 1 through the rotation shaft 5. That is, the engaging arm 30 is pivoted on one side of the wireless module 1 through a rotation shaft 5, and the engaging arm 31 is pivoted on another side of the wireless module 1 through another rotation shaft 5. It may be understood that the rotation shaft 5 also can be substituted by a rotatable resilient element such as a leaf spring, a torsional spring, which has a certain rotation redundancy.

Alternatively, in the AAS shown in FIG. 5, the rotation shaft 5 set on one side of the wireless module 1 and connected to the engaging arm 30 and the rotation shaft 5 set on another side of the wireless module 1 and connected to the engaging arm 31 are an integrated structure, which enhances the stability of the rotation of the engaging arms 30, 31. Certainly, the implementation of the present invention will not be affected in the case that the rotation shaft 5 set on one side of the wireless module 1 and connected to the engaging arm 30 and the rotation shaft 5 set on another side of the wireless module 1 and connected to the engaging arm 31 are not an integrated structure.

Alternatively, in the AAS shown in FIG. 5, each group of engaging elements 3 includes two engaging arms, i.e., engaging arm 30 and engaging arm 31, which are symmetrically set on opposite sides of the wireless module 1.

Alternatively, in the AAS shown in FIG. 5, the two engaging arms, i.e., engaging arm 30 and engaging arm 31, of each group of engaging elements 3 set on the wireless module 1 are connected with a transverse rod 32, which is arranged on the two engaging arms, i.e., engaging arm 30 and engaging arm 31, connected by transverse rod 32 at the opposite end to the buckles. In the fixing state of the wireless module 1 and the main board 2, the transverse rod 32 tightly presses from the side of the wireless module 1 away from the main board 2 to facing the direction where the main board 2 located.

Alternatively, in the AAS shown in FIG. 5, the buckle formed on each engaging arm, i.e., engaging arm 30 and engaging arm 31, of each group of engaging elements 3 at the end corresponding to the protrusion 4 of the second buckle member is a crook structure. As shown in FIG. 5, in the fixing state of the wireless module 1 and the main board 2, the crook structure 311 of each engaging arm, i.e., engaging arm 30 and engaging arm 31, and the protrusion set on the main board 2 buckle with each other, and the opening of the crook structure faces towards the side where the wireless module 1 is located.

Figure 6:
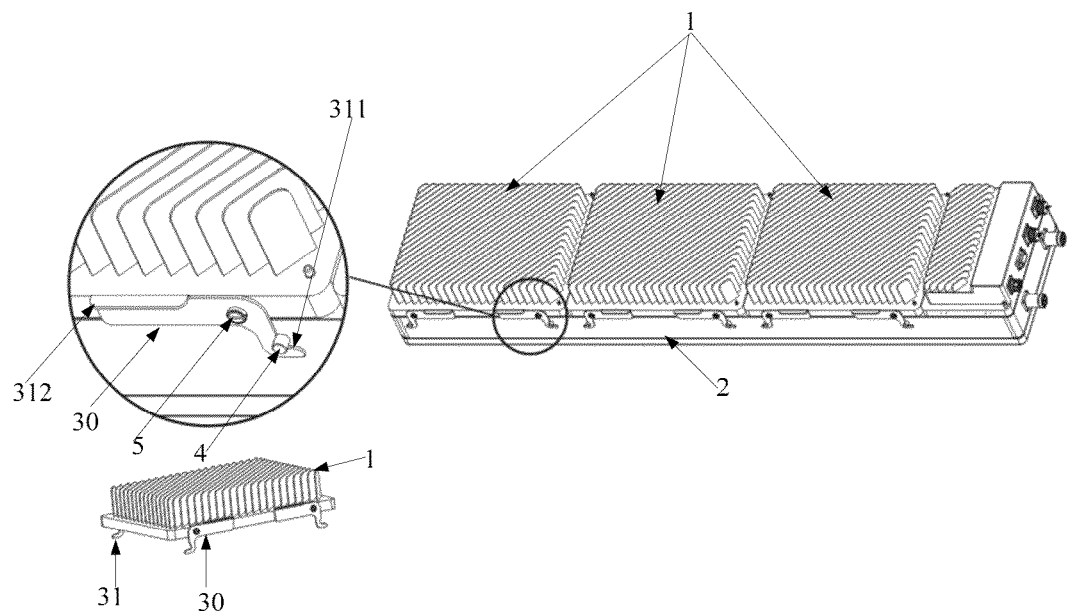
FIG. 6 is a schematic structure diagram of another AAS provided in an embodiment of the present invention.

Alternatively, each engaging arm, i.e., engaging arm 30 and engaging arm 31, of the each group of engaging elements 3 set on the wireless module 1 may have a shape as shown in FIG. 6. Wherein, flanges 312 may be formed on the outer surfaces of the engaging arms 30, 31 at the opposite end to the buckles, i.e., the crook structures 311), the flanges 312 are perpendicular to the outer surface. Wherein, aeting flanges 312 on the outer surfaces of the engaging arms 30 and 31 can convenience rotation of the engaging arms 30 and 31.

In Embodiment 2, the wireless module and the main board of an active antenna are engaged to avoid fastening with screws, making it possible for an operator to perform attaching and detaching operations aloft by hands without multiple person cooperation and tools for detachment and attachment, so that the maintenance cost of the active antenna can be reduced and maintenance efficiency can be improved.

Embodiment 3

Figure 7A:
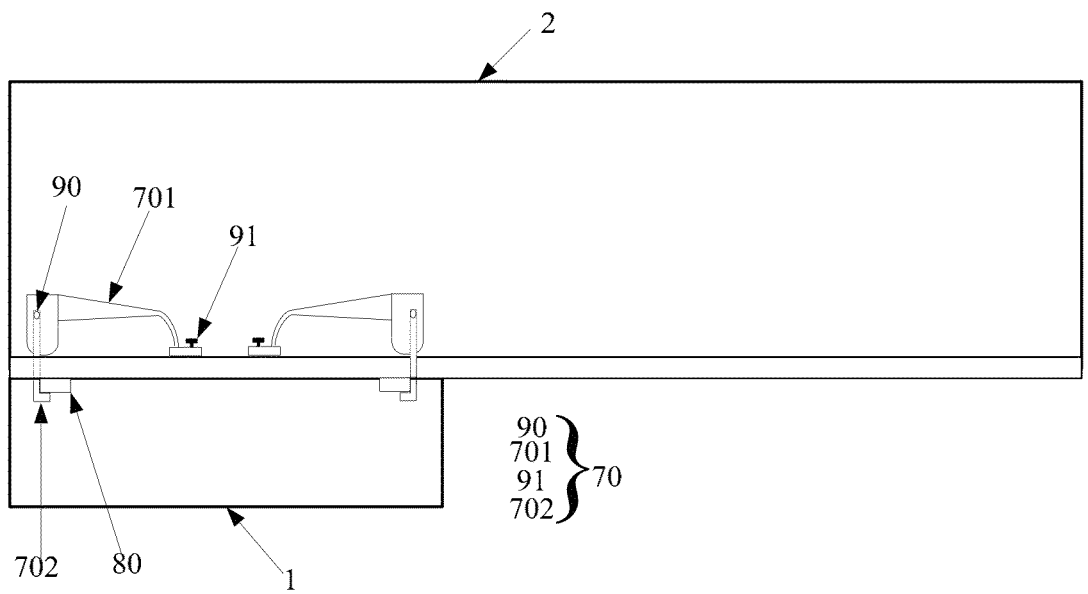
FIGS. 7a and 7b are left and right schematic structure diagrams of another AAS provided in an embodiment of the present invention, respectively.
Figure 7B:
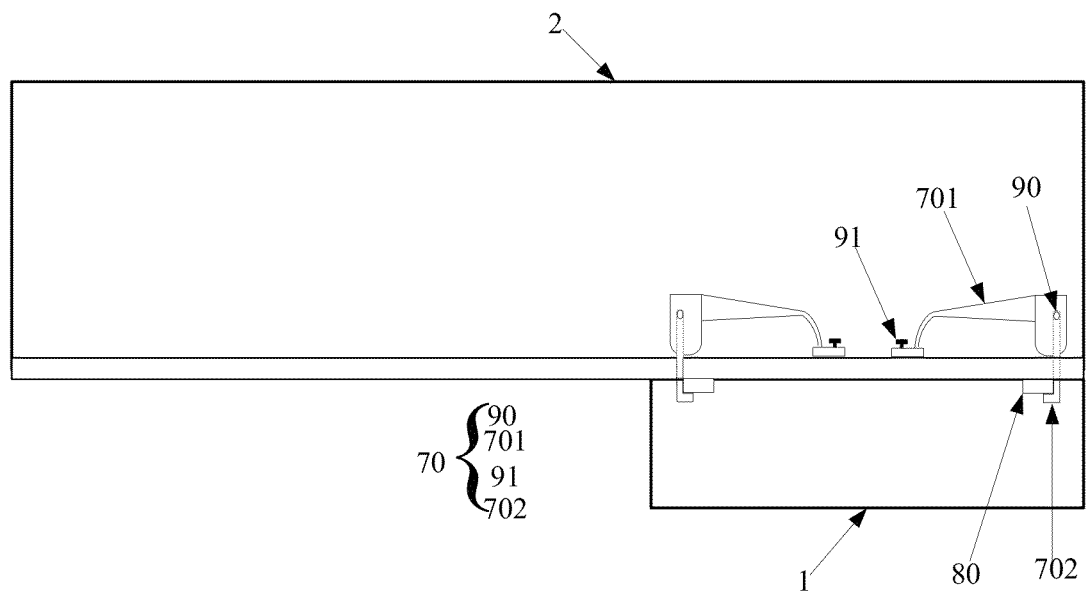

Referring to FIG. 7a and FIG. 7b, FIGS. 7a and 7b are left and right schematic structure diagrams of another AAS provided in an embodiment of the present invention. As shown in FIGS. 7a and 7b, the AAS may include:

a main board 2 and at least one wireless module 1; a first buckle member set on the at least one wireless module 1, a second buckle member set on the main board 2 corresponding to the first buckle member on the least one wireless module 1; the first buckle member of the at least one wireless module 1 clasps the second buckle member of the main board 2, thereby fixing the wireless module 1 on the main board 2.

Alternatively, in the AAS shown in FIGS. 7a and 7b, the second buckle member set on the main board 2 may include at least one group of tightening mechanism 70 passing through the left side of the main board 2, and at least one group of tightening mechanism 70 passing through the right side of the main board 2; the handle-compression rod mechanism 70 consists of a handle 701 and a compression rod 702.

Correspondingly, in the AAS shown in FIGS. 7a and 7b, the first buckle member set on the at least one wireless module 1 may include buckles 80 set on the left side of the wireless module 1 corresponding to the at least one group of tightening mechanism 70 on the left side of the main board 2, and buckles 80 set on the right side of the wireless module 1 corresponding to the at least one group of tightening mechanism 70 on the right side of the main board 2.

Wherein in the fixing state of the wireless module 1 and the main board 2, the handles 701 of each group of tightening mechanism 70 are rotated towards the main board 2 until the handle tails of each group of tightening mechanism 70 contact the main board 2, the compression rods 702 of each group of tightening mechanism 70 rise under the handle tensile force of each group of tightening mechanism 70 to buckle the corresponding buckles 80 on the wireless module 1.

Alternatively, in the AAS shown in FIG. 7a, the handle heads of each group of tightening mechanism 70 on the left side of the main board 2 contact the main board 2, the compression rods 702 of each group of tightening mechanism 70 on the left side of the main board 2 pass through the left side of the main board 2, one end of the compression rods 702 is connected to the handle heads of each group of tightening mechanism 70 on the left side of the main board 2 through rotation shafts 90 set on the handle heads of each group of tightening mechanism 70 on the left side of the main board 2; in the fixing state of the wireless module 1 and the main board 2, the handles of each group of tightening mechanism 70 are rotated towards the main board 2 until the handle tails of each group of tightening mechanism 70 contact the main board 2, the other end of the compression rods 702 of each group of tightening mechanism 70 rises under the tensile force of the tightening mechanism 70 to buckle the corresponding buckles 80 on the left side of the wireless module 1. At this point, the sum of the distance between the rotation shafts 90 on the handle heads of each group of tightening mechanism 70 on the left side of the main board 2 and the main board 2, the thickness of the left side of the main board 2, and the thickness of the corresponding buckles 80 on the left side of the wireless module 1 is equal to the distance between the rotation shafts 90 on the handle heads of each group of tightening mechanism 70 on the left side of the main board 2 and the other end of the compression rods 702 of each group of tightening mechanism 70 on the left side of the main board 2.

Alternatively, in the AAS shown in FIG. 7b, the handle heads of each group of tightening mechanism 70 on the right side of the main board 2 contact the main board 2, the compression rods 702 of each group of tightening mechanism 70 on the right side of the main board 2 pass through the right side of the main board 2, and one end of the compression rods 702 is connected to the handle heads of each group of tightening mechanism 70 on the right side of the main board 2 through rotation shafts 90 set on the handle heads of each group of tightening mechanism 70 on the right side of the main board 2; in the fixing state of the wireless module 1 and the main board 2, the handles of each group of tightening mechanism 70 are rotated towards the main board 2 until the handle tails of each group of tightening mechanism 70 contact the main board 2, the other end of the compression rods 702 of each group of tightening mechanism 70 rises under the tensile force of the tightening mechanism 70 to buckle the corresponding buckles 80 on the right side of the wireless module 1. At this point, the sum of the distance between the rotation shafts 90 on the handle heads of each group of tightening mechanism 70 on the right side of the main board 2 and the main board 2, the thickness of the right side of the main board 2, and the thickness of the corresponding buckles 80 on the right side of the wireless module 1 is equal to the distance between the rotation shafts 90 on the handle heads of each group of tightening mechanism 70 on the right side of the main board 2 and the other end of the compression rods 702 of each group of tightening mechanism 70 on the right side of the main board 2.

Alternatively, in the AAS shown in FIGS. 7a and 7b, tool-less manual locking screws 91 can be set at the handle tail end of each group of tightening mechanism 70. In the state of rotating the handles of each group of tightening mechanism 70 towards the main board 2 until the handle tails of each group of tightening mechanism 70 contact the main board 2, the handles of each group of tightening mechanism 70 are fastened on the main board 2 with the tool-less manual locking screws 91.

In Embodiment 3, the wireless module and the main board of an active antenna are engaged to avoid fastening with screws, making it possible for an operator to perform attaching and detaching operations aloft by hands without multiple person cooperation and tools for detachment and attachment, so that the maintenance cost of the active antenna can be reduced and maintenance efficiency can be improved.

Embodiment 4

Figure 8:
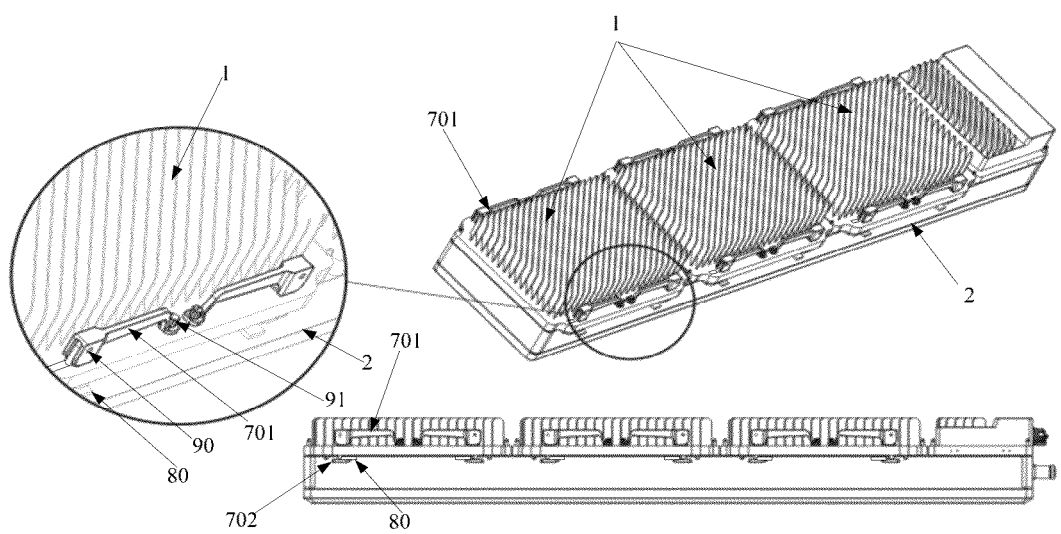
FIG. 8 is a schematic structure diagram of another AAS provided in an embodiment of the present invention.

Referring to FIG. 8, FIG. 8 is a schematic structure diagram of another AAS provided in an embodiment of the present invention. As shown in FIG. 8, the AAS may include:

a main board 2 and at least one wireless module 1; a first buckle member set on the at least one wireless module 1, a second buckle member set on the main board 2 corresponding to the first buckle member on the least one wireless module 1; the first buckle member of the at least one wireless module 1 clasps the second buckle member of the main board 2, thereby fixing the wireless module 1 on the main board 2.

Alternatively, in the AAS shown in FIG. 8, the first buckle member set on the wireless module 1 may include at least one group of tightening mechanism 70 passing through the left side of the wireless module 1, and at least one group of tightening mechanism 70 passing through the right side of the wireless module 1; wherein, the handle-compression rod mechanism 70 consists of a handle 701 and a compression rod 702.

Correspondingly, in the AAS shown in FIG. 8, the second buckle member set on the main board 2 may include buckles 80 set on the left side of the main board 2 corresponding to the at least one group of tightening mechanism 70 on the left side of the wireless module 1, and buckles 80 set on the right side of the main board 2 corresponding to the at least one group of tightening mechanism 70 on the right side of the wireless module 1.

Wherein in the fixing state of the wireless module 1 and the main board 2, the handles of each group of tightening mechanism 70 are rotated towards the wireless module 1 until the handle tails of each group of tightening mechanism 70 contact the wireless module 1, the compression rods 702 of each group of tightening mechanism 70 rise under the handle tensile force of each group of tightening mechanism 70 to buckle the corresponding buckles 80 on the main board 2.

Alternatively, in the AAS shown in FIG. 8, the handle heads of each group of tightening mechanism 70 on the left side of the wireless module 1 contact the wireless module 1, the compression rods 702 of each group of tightening mechanism 70 on the left side of the wireless module 1 pass through the left side of the wireless module 1, one end of the compression rods 702 is connected to the handle heads of each group of tightening mechanism 70 on the left side of the wireless module 1 through rotation shafts 90 set on the handle heads of each group of tightening mechanism 70 on the left side of the wireless module 1; in the fixing state of the wireless module 1 and the main board 2, the handles of each group of tightening mechanism 70 are rotated towards the wireless module 1 until the handle tails of each group of tightening mechanism 70 contact the wireless module 1, the other end of the compression rods 702 of each group of tightening mechanism 70 rises under the tensile force of the tightening mechanism 70 to buckle the corresponding buckles 80 on the left of the main board 2. At this point, the sum of the distance between the rotation shafts 90 on the handle heads of each group of tightening mechanism 70 on the left side of the wireless module 1 and the wireless module 1, the thickness of the left side of the wireless module 1, and the thickness of the corresponding buckles 80 on the left of the main board 2 is equal to the distance between the rotation shafts 90 on the handle heads of each group of tightening mechanism 70 on the left side of the wireless module 1 and the other end of the compression rods 702 of each group of tightening mechanism 70 on the left side of the wireless module 1.

Alternatively, in the AAS shown in FIG. 8, the handle heads of each group of tightening mechanism 70 on the right side of the wireless module 1 contact the wireless module 1, the compression rods 702 of each group of tightening mechanism 70 on the right side of the wireless module 1 pass through the right side of the wireless module 1, and one end of the compression rods 702 is connected to the handle heads of each group of tightening mechanism 70 on the right side of the wireless module 1 through rotation shafts 90 set on the handle heads of each group of tightening mechanism 70 on the right side of the wireless module 1; in the fixing state of the wireless module 1 and the main board 2, the handles of each group of tightening mechanism 70 are rotated towards the wireless module 1 until the handle tails of each group of tightening mechanism 70 contact the wireless module 1, the other end of the compression rods 702 of each group of tightening mechanism 70 rises under the tensile force of the tightening mechanism 70 to buckle the corresponding buckles 80 on the right side of the main board 2. At this point, the sum of the distance between the rotation shafts 90 on the handle heads of each group of tightening mechanism 70 on the right side of the wireless module 1 and the wireless module 1, the thickness of the right side of the wireless module 1, and the thickness of the corresponding buckles 80 on the right side of the main board 2 is equal to the distance between the rotation shafts 90 on the handle heads of each group of tightening mechanism 70 on the right side of the main board 2 and the other end of the compression rods 702 of each group of tightening mechanism 70 on the right side of the wireless module 1.

Alternatively, in the AAS shown in FIG. 8, tool-less manual locking screws 91 can be set on the handle tail end of each group of tightening mechanism 70, in the state of rotating the handles of each group of tightening mechanism 70 towards the wireless module 1 until the handle tails of each group of tightening mechanism 70 contact the wireless module 1, the handles of each group of tightening mechanism 70 are fastened on the wireless module 1 with the tool-less manual locking screws 91.

Figure 9:
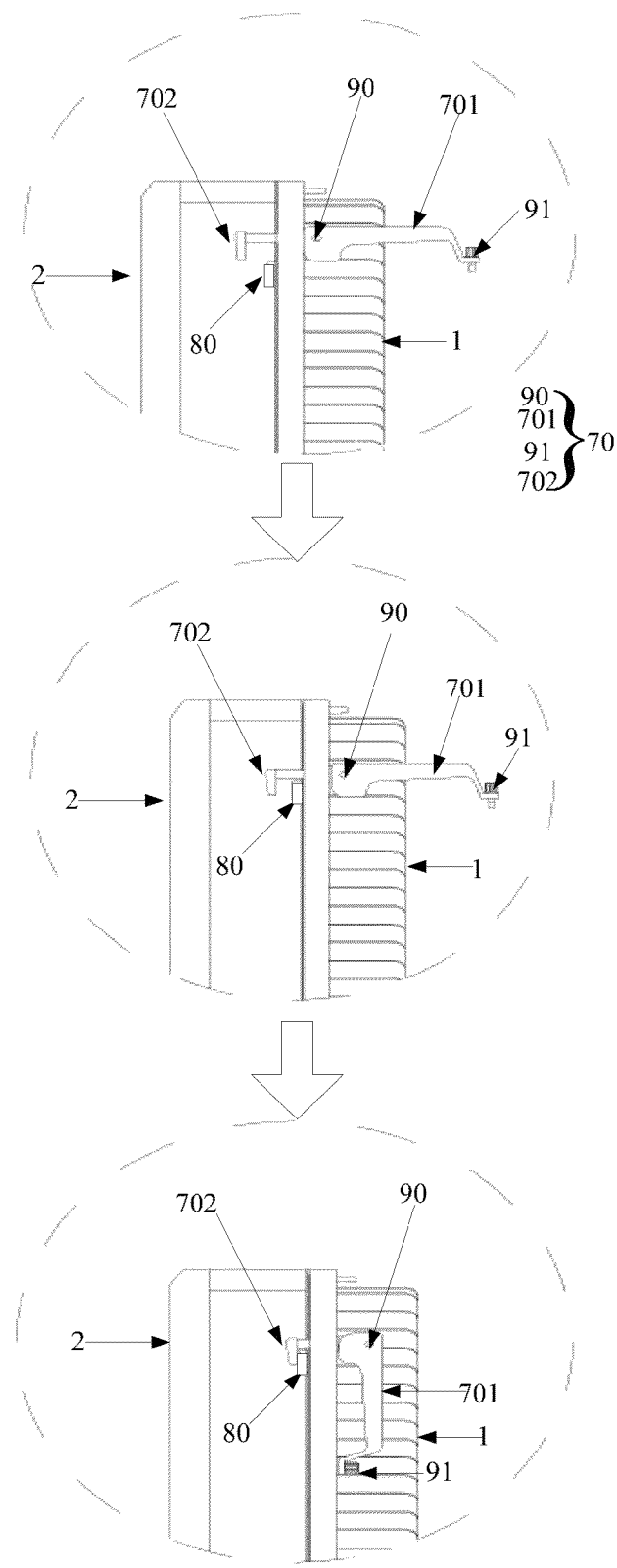
FIG. 9 is a right side view of the latch of a wireless module 1 and a main board 2 of the AAS shown in FIG. 8.

Also referring to FIG. 9, FIG. 9 is a right side view of the latch of a wireless module 1 and a main board 2 of the AAS shown in FIG. 8. It can be seen from FIG. 9, when the handles of each group of tightening mechanism 70 set on the right side of the wireless module 1 are rotated towards the wireless module 1 until the handle tails of each group of tightening mechanism 70 contact the wireless module 1, the compression rods 702 of each group of tightening mechanism 70 rises under the tensile force of the tightening mechanism 70 to buckle the corresponding buckles 80 on the main board 2, realizing buckling between the wireless module 1 and the right side of the main board 2. Further, the handles of each group of tightening mechanism 70 set on the right side of the wireless module 1 are fastened on the wireless module 1 with the tool-less manual locking screws 91.

In Embodiment 4, the wireless module and the main board of an active antenna are engaged to avoid fastening with screws, making it possible for an operator to perform attaching and detaching operations aloft by hands without multiple person cooperation and tools for detachment and attachment, so that the maintenance cost of the active antenna can be reduced and maintenance efficiency can be improved.

Embodiment 5

Figure 10:
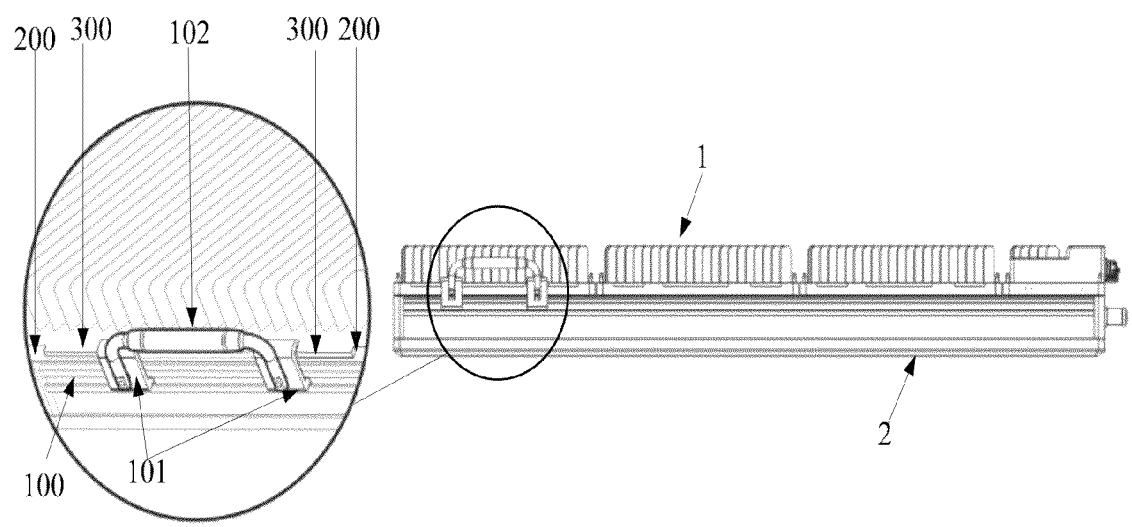
FIG. 10 is a schematic structure diagram of another AAS provided in an embodiment of the present invention.

Referring to FIG. 10, FIG. 10 is a schematic structure diagram of yet another AAS provided in an embodiment of the present invention. As shown in FIG. 10, the AAS may include:

a main board 2 and at least one wireless module 1; a first buckle member set on the at least one wireless module 1, a second buckle member set on the main board 2 corresponding to the first buckle member on the least one wireless module 1; the first buckle member of the at least one wireless module 1 clasps the second buckle member of the main board 2, thereby fixing the wireless module 1 on the main board 2.

Alternatively, in the AAS shown in FIG. 10, the second buckle member set on the main board 2 may include a sliding slot 100 set on one side of the main board 2, and a sliding slot 100 set on another side of the main board; buckles 101 are set on the sliding slots of the main board 2; wherein a side of the main board 2 occupied by the at least one wireless module 1 intersects with the side of the main board 2 where the sliding slot 100 is set and the other side of the main board 2 where the other sliding slot 100 is set.

Correspondingly, in the AAS shown in FIG. 10, the first buckle member set on the at least one wireless module 1 may include a sliding track 200 set on one side of the wireless module 1 corresponding to the side of the main board 2 where the sliding slot 100 is set, and a sliding track 200 set on other side of the wireless module 1 corresponding to the side of the main board 2 where the other sliding slot 100 is set; wherein, projections 300 are set in the sliding tracks 200;

wherein, in the fixing state of the wireless module 1 and the main board 2, the buckles 101 set on the sliding slot 100 on one side of the main board 2 buckle the projection 300 in the sliding track 200 set on one side of the wireless module 1 corresponding to the one side of the main board 2; and the buckles 101 set on the sliding slot 100 on the other side of the main board 2 buckle the projection 300 in the sliding track 200 set on the other side of the wireless module 1 corresponding to the other side of the main board 2.

Alternatively, in the AAS shown in FIG. 10, the two sliding tracks 200 are set on one side of the wireless module 1 corresponding to the side of sliding slot 100 of the main board 2 are connected by a handle 102, and the two sliding tracks 200 are set on other side of the wireless module 1 corresponding to the other side of sliding slot 100 of the main board 2 are connected by a handle 102; the two buckles 101 are set on the sliding slot 100 at one side of the main board 2 corresponding to one side of the wireless module 1; the two buckles 101 are set on the sliding slot 100 at other side of the main board 2 corresponding to the other side of the wireless module 1

Alternatively, in the AAS shown in FIG. 10, the two buckles 101 set on the sliding slot 100 at one side of the main board 2 corresponding to one side of the wireless module 1 are connected by a handle 102, which is used to adjust the distance between the two buckles 101 set on the sliding slot 100 on the one side of the main board 2; and the two buckles 101 set on the sliding slot 100 on other side of the main board 2 corresponding to other side of the wireless module 1 are connected by a handle 102, which is used to adjust the distance between the two buckles 101 set on the sliding slot 100 on the other side of the main board 2.

In the AAS shown in FIG. 10, when the handle 102 is rotated away from the wireless module 1, the two buckles 101 connected by the handle 102 separate with each other, and when the handle 102 is rotated toward the wireless module 1, the two buckles 101 connected by the handle 102 become close to each other.

In the AAS shown in FIG. 10, the wireless module 1 and the main board 2 are tightly engaged to avoid fastening with screws, making it possible for an operator to perform attaching and detaching operations aloft by hands without multiple person cooperation and tools for detachment and attachment, so that the maintenance cost of the active antenna can be reduced and maintenance efficiency can be improved.

The AAS described above in the embodiments of the present invention has the following advantages.

1. The problem of having to operate by multiple people cooperatively in the maintenance of AAS due to heavy and bulky wireless modules can be addressed.
2. Risks of tool dropping or wireless module falling off in aloft working can be reduced.
3. Weariness of users produced from fastening operation of multiple screws can be reduced, so that human safety risk can be reduced.
4. The problem in screw fastening operation of unsatisfied user accessibility due to different screw hole positions can be reduced.
5. The risk of disabled water protection due to improper field assembly can be reduced.

An active antenna provided in embodiments of the present invention has been particularly described above. Some specific examples are given herein for illustrating the principle and implementation of the present invention, and the description of the above embodiments is merely for understanding the present invention; at the same time, for those ordinary skilled in the art, according to the concept of the present invention, modifications can be made to particular implementations and applications. In summary, it should not be conceived as limit of the present invention

What is claimed is:

1. An active antenna, comprising:
   a main board and at least one wireless module;
   a first buckle member set on the at least one wireless module; and
   a second buckle member set on the main board corresponding to the first buckle member on the least one wireless module;
   wherein the wireless module is fixed on the main board by operation of clasping the first buckle member of the at least one wireless module and the second buckle member of the main board.

2. The active antenna according to claim 1, wherein
   the first buckle member includes at least one group of engaging elements, the at least one engaging arm of at least one group of the engaging elements being pivoted on one side of the wireless module, and at least another engaging arm of at least one group of the engaging elements being pivoted on the other side of the wireless module, wherein the side of the wireless module where the at least one engaging arm is set as well as the side of the wireless module where the at least another engaging arm is set intersect with the side of the wireless module covered by the main board;
   the second buckle member includes protrusions corresponding to the at least one engaging arm and the at least another engaging arm respectively; the protrusions being set on two sides of the main board adjacent to the side occupied by the wireless module;
   a buckle is formed on each engaging arm of the at least one group of the engaging elements at the end corresponding to the protrusion of the second buckle member, in the fixing state of the wireless module and the main board, the buckle of each engaging arm buckling the protrusion of the first buckle member set on the wireless module.

3. The active antenna according to claim 2, wherein the first buckle member includes rotation shafts, and the engaging arms of the first buckle member are pivoted-set on the wireless module via the rotation shafts.

4. The active antenna according to claim 2, wherein each group of the engaging elements includes two engaging arms, which are symmetrically set on opposite sides of the wireless module.

5. The active antenna according to claim 4, wherein the two engaging arms of each group of the engaging elements of the first buckle member are connected with a transverse rod, which is arranged at the opposite end to the buckles on the two engaging arms connected by the transverse rod,
   in the fixing state of the wireless module and the main board, the transverse rod tightly pressing the wireless module from the side of the wireless module away from the main board to facing the direction where the main board located.

6. The active antenna according to claim 4, wherein the buckle formed on the each of the two engaging arms at the end corresponding to the protrusion of the second buckle member is a crook structure,
   in the fixing state of the wireless module and the main board, the crook structure of the each engaging arm and the protrusion set on the main board buckling with each other, and the opening of the crook structure facing towards the side where the wireless module is located.

7. The active antenna according to claim 4, wherein
   a flange is formed on the outer surface of each of the two engaging arms at the opposite end to the buckle, which is perpendicular to the outer surface.

8. The active antenna according to claim 7, wherein
   tool-less manual locking screws are set on the handle tails of each group of handle-compression rod mechanism, in the state of rotating the handles of each set of handle-compression rod mechanism towards the main board until the handle tails of each set of handle-compression rod mechanism contact the main board, the handles of each set of handle-compression rod mechanism being fastened on the main board with the tool-less manual locking screws.

9. The active antenna according to claim 1, wherein
   the second buckle member includes at least one set of a handle-compression rod mechanism passing through the left side of the main board, and at least one set of a handle-compression rod mechanism passing through the right side of the main board, each of the two sets of handle-compression rod mechanism consisting of a handle and a compression rod;
   the first buckle member includes buckle set on the left side of the wireless module corresponding to the at least one set of the handle-compression rod mechanism on the left side of the main board, and buckle set on the right side of the wireless module corresponding to the at least one set of the handle-compression rod mechanism on the right side of the main board;
   in the fixing state of the wireless module and the main board, the handles of each of the two sets of handle-compression rod mechanism are rotated towards the main board until the handle tails of each of the two sets of handle-compression rod mechanism contact the main board, and the compression rod of each of the two sets of handle-compression rod mechanism rise under the handle tensile force of each of the two sets of handle-compression rod mechanism to buckle the corresponding buckles on the wireless module.

10. The active antenna according to claim 1, wherein
    the first buckle member includes at least one set of a handle-compression rod mechanism passing through the left side of the wireless module, and at least one set of a handle-compression rod mechanism passing through the right side of the wireless module, the handle-compression rod mechanism consisting of a handle and a compression rod;

the second buckle member comprises buckle set on the left side of the main board corresponding to the at least one set of a handle-compression rod mechanism on the left side of the wireless module, and buckle set on the right side of the main board corresponding to the at least one set of a handle-compression rod mechanism on the right side of the wireless module;

in the fixing state of the wireless module and the main board, the handles of each of the two sets of handle-compression rod mechanism are rotated towards the wireless module until the handle tails of each of the two sets of handle-compression rod mechanism contact the wireless module, and the compression rods of each of the two sets of handle-compression rod mechanism rise under the handle tensile force of each of the two sets of handle-compression rod mechanism to buckle the corresponding buckles on the main board.

11. The active antenna according to claim 10, wherein tool-less manual locking screws are set on the handle tails of each of the two sets of handle-compression rod mechanism, in the state of rotating the handle of each of the two sets of handle-compression rod mechanism towards the wireless module until the handle tail of each of the two sets of handle-compression rod mechanism contacts the wireless module, the handle of each of the two sets of handle-compression rod mechanism being fastened on the wireless module with the tool-less manual locking screws.

12. The active antenna according to claim 1, comprising: the second buckle member comprises a sliding slot set on one side of the main board, and a sliding slot set on another side of the main board; buckles set on the two sliding slots of the main board; wherein the side of the main board occupied by the at least one wireless module intersects with the side of the main board where the sliding slot is set and the other side of the main board where the other sliding slot is set;

the first buckle member comprises a sliding track set on one side of the wireless module corresponding to the side of the main board where the sliding slot is set, and a sliding track set on other side of the wireless module corresponding to the side of the main board where the other sliding slot is set; projections are set in the sliding tracks;

in the fixing state of the wireless module and the main board, the buckles set on the sliding slot on one side of the main board buckles the projection in the sliding track set on one side of the wireless module corresponding to the one side of the main board; and the buckles set on the sliding slot on the other side of the main board buckles the projection in the sliding track set on the other side of the wireless module corresponding to the other side of the main board.

13. The active antenna according to claim 12, wherein two sliding tracks are set on the side of the wireless module corresponding to the side of the main board where the sliding slot is set, two sliding tracks are set on the other side of the wireless module corresponding to the other side of the main board where the other sliding slot is set; two of the buckles are set on the sliding slot on one side of the main board corresponding to one side of the wireless module; and two of the buckles are set on the sliding slot on the other side of the main board corresponding to the other side of the wireless module.

14. The active antenna according to claim 13, wherein the two of the buckles set on the sliding slot on one side of the main board corresponding to one side of the wireless module are connected by a handle, and the two of the buckles set on the sliding slot on the other side of the main board corresponding to the other side of the wireless module are connected by another handle, each of the two handles being used to adjust the distance between the two buckles being connected.

15. The active antenna according to claim 1, wherein the second buckle member includes at least one group of engaging elements, at least one engaging arm of the at least one group of the engaging elements being pivoted-set on a first side of the main board, and at least another engaging arm of the at least one group of engaging elements being pivoted-set on a second side of the main board which is an opposite side of the first side, a third side of the main board occupied by the at least one wireless module intersects with the first side of the main board and the second side of the main board, respectively;

the first buckle member includes protrusions corresponding to the at least one engaging arm and the at least another engaging arm, respectively, the protrusions being set on two sides of the wireless module adjacent to the side covered by the main board;

a buckle is formed on each engaging arm of the at least one group of the engaging elements at the end corresponding to the protrusion of the first buckle member; in the fixing state of the wireless module and the main board, the buckle of each engaging arm buckling the protrusion of the first buckle member set on the wireless module.

16. The active antenna according to claim 15, wherein the second buckle member comprises rotation shafts, and the engaging arms of the second buckle member are pivoted-set on the main board through the rotation shafts.

17. The active antenna according to claim 16, wherein the rotation shafts are rotatable resilient elements.

18. The active antenna according to claim 15, wherein each group of the engaging elements includes two engaging arms, which are symmetrically set on opposite sides of the main board.

19. The active antenna according to claim 18, wherein the two engaging arms of each group of the engaging elements of the second buckle member are connected with a transverse rod, which is arranged on the opposite end to the buckles of the two engaging arms connected by the transverse rod, in the fixing state of the wireless module and the main board, the transverse rod tigtly pressing the wireless module from the side of the wireless module away from the main board to facing the direction where the main board located.

20. The active antenna according to claim 18, wherein the buckle formed on the each of the two engaging arms at the end corresponding to the protrusion of the first buckle member is a crook structure, in the fixing state of the wireless module and the main board, the crook structure of the each engaging arm and the protrusion set on the wireless module buckling with each other, and the opening of the crook structure facing towards the side where the main board is located.

21. The active antenna according to claim 18, wherein a flange is formed on the outer surface of each of the two engaging arms at the opposite end to the buckle, the flange is perpendicular to the outer surface.

* * * * *

UNITED STATES PATENT AND TRADEMARK OFFICE
CERTIFICATE OF CORRECTION

PATENT NO. : 8,760,353 B2  
APPLICATION NO. : 13/602737  
DATED : June 24, 2014  
INVENTOR(S) : Wei et al.

Page 1 of 1

It is certified that error appears in the above-identified patent and that said Letters Patent is hereby corrected as shown below:

Title page, item (63), Related U.S. Application Data "PCT/CN2010/079284" should read --PCT/CN2011/079284--.

In the Claims:

Column 12, Claim 5, line 10 "board located" should read --board is located--.

Column 14, Claim 19, line 47 "tigtly" should read --tightly--.

Column 14, Claim 19, line 50 "board located" should read --board is located--.

Signed and Sealed this  
Thirtieth Day of September, 2014

Michelle K. Lee  
*Deputy Director of the United States Patent and Trademark Office*